(12) United States Patent
Bowering et al.

(10) Patent No.: US 7,109,503 B1
(45) Date of Patent: Sep. 19, 2006

(54) SYSTEMS FOR PROTECTING INTERNAL COMPONENTS OF AN EUV LIGHT SOURCE FROM PLASMA-GENERATED DEBRIS

(75) Inventors: Norbert R. Bowering, San Diego, CA (US); Bjorn A. M. Hansson, La Jolla, CA (US); Alexander N. Bykanov, San Diego, CA (US); Oleh Khodykin, San Diego, CA (US); Alexander I. Ershov, San Diego, CA (US); William N. Partlo, Poway, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 11/067,099

(22) Filed: Feb. 25, 2005

(51) Int. Cl.
*G01J 1/00* (2006.01)

(52) U.S. Cl. .............................. 250/503.1; 250/503.1; 250/504 R

(58) Field of Classification Search ............ 250/503.1, 250/504 R
See application file for complete search history.

(56) References Cited

U.S. PATENT DOCUMENTS

| | | | |
|---|---|---|---|
| 2,759,106 A | 8/1956 | Wolter | 250/53 |
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |
| 3,961,197 A | 6/1976 | Dawson | 250/493 |
| 3,969,628 A | 7/1976 | Roberts et al. | 250/402 |
| 4,042,848 A | 8/1977 | Lee | 313/231.6 |
| 4,088,966 A | 5/1978 | Samis | 313/231.5 |
| 4,143,275 A | 3/1979 | Mallozzi et al. | 250/503 |
| 4,162,160 A | 7/1979 | Witter | 75/246 |
| 4,203,393 A | 5/1980 | Giardini | 123/30 |
| 4,364,342 A | 12/1982 | Asik | 123/143 |
| 4,369,758 A | 1/1983 | Endo | 123/620 |

(Continued)

FOREIGN PATENT DOCUMENTS

JP 2000091096 A 3/2000

OTHER PUBLICATIONS

Andreev, et al., "Enhancement of laser/EUV conversion by shaped laser pulse interacting with Li-contained targets for EUV lithography", Proc. Of *SPIE*, 5196:128-136, (2004).

(Continued)

*Primary Examiner*—Jack Berman
*Assistant Examiner*—Jennifer Yantorno
(74) *Attorney, Agent, or Firm*—William C. Cray; Matthew K. Hillman

(57) ABSTRACT

Systems and methods are disclosed for protecting an EUV light source plasma production chamber optical element surface from debris generated by plasma formation. In one aspect of an embodiment of the present invention, a shield is disclosed which comprises at least one hollow tube positioned between the optical element and a plasma formation site. The tube is oriented to capture debris while allowing light to pass through the tube's lumen via reflection at relatively small angles of grazing incidence. In another aspect of an embodiment of the present invention, a shield is disclosed which is heated to a temperature sufficient to remove one or more species of debris material that has deposited on the shield. In yet another aspect of an embodiment of the present invention, a system is disclosed which a shield is moved from a light source plasma chamber to a cleaning chamber where the shield is cleaned.

20 Claims, 4 Drawing Sheets

U.S. PATENT DOCUMENTS

| | | | | |
|---|---|---|---|---|
| 4,504,964 | A | 3/1985 | Cartz et al. | 378/119 |
| 4,507,588 | A | 3/1985 | Asmussen et al. | 315/39 |
| 4,536,884 | A | 8/1985 | Weiss et al. | 378/119 |
| 4,538,291 | A | 8/1985 | Iwamatsu | 378/119 |
| 4,561,406 | A | 12/1985 | Ward | 123/536 |
| 4,596,030 | A | 6/1986 | Herziger et al. | 378/119 |
| 4,618,971 | A | 10/1986 | Weiss et al. | 378/34 |
| 4,626,193 | A | 12/1986 | Gann | 431/71 |
| 4,633,492 | A | 12/1986 | Weiss et al. | 378/119 |
| 4,635,282 | A | 1/1987 | Okada et al. | 378/34 |
| 4,751,723 | A | 6/1988 | Gupta et al. | 378/119 |
| 4,752,946 | A | 6/1988 | Gupta et al. | 378/119 |
| 4,774,914 | A | 10/1988 | Ward | 123/162 |
| 4,837,794 | A | 6/1989 | Riordan et al. | 378/119 |
| 4,928,020 | A | 5/1990 | Birx et al. | 307/106 |
| 5,023,897 | A | 6/1991 | Neff et al. | 378/122 |
| 5,027,076 | A | 6/1991 | Horsley et al. | 324/674 |
| 5,102,776 | A | 4/1992 | Hammer et al. | 430/311 |
| 5,126,638 | A | 6/1992 | Dethlefsen | 315/326 |
| 5,142,166 | A | 8/1992 | Birx | 307/106 |
| 5,175,755 | A | 12/1992 | Kumakhov | 378/34 |
| 5,313,481 | A | 5/1994 | Cook et al. | 372/37 |
| 5,319,695 | A | 6/1994 | Itoh et al. | 378/84 |
| RE34,806 | E | 12/1994 | Cann | 427/446 |
| 5,411,224 | A | 5/1995 | Dearman et al. | 244/53 |
| 5,448,580 | A | 9/1995 | Birx et al. | 372/38 |
| 5,504,795 | A | 4/1996 | McGeoch | 378/119 |
| 5,729,562 | A | 3/1998 | Birx et al. | 372/38 |
| 5,763,930 | A | 6/1998 | Partlo | 250/504 |
| 5,866,871 | A | 2/1999 | Birx | 219/121 |
| 5,936,988 | A | 8/1999 | Partlo et al. | 372/38 |
| 5,963,616 | A | 10/1999 | Silfvast et al. | 378/122 |
| 5,970,076 | A | 10/1999 | Hamada | 372/20 |
| 6,031,241 | A | 2/2000 | Silfvast et al. | 250/504 |
| 6,031,598 | A | 2/2000 | Tichenor et al. | 355/67 |
| 6,039,850 | A | 3/2000 | Schulz | 204/192.15 |
| 6,051,841 | A | 4/2000 | Partlo | 250/504 |
| 6,064,072 | A | 5/2000 | Partlo et al. | 250/504 |
| 6,172,324 | B1 | 1/2001 | Birx | 219/121.57 |
| 6,195,272 | B1 | 2/2001 | Pascente | 363/21 |
| 6,285,743 | B1 | 9/2001 | Kondo et al. | 378/119 |
| 6,307,913 | B1 | 10/2001 | Foster et al. | 378/34 |
| 6,317,448 | B1 | 11/2001 | Das et al. | 372/32 |
| 6,377,651 | B1 | 4/2002 | Richardson et al. | 378/34 |
| 6,396,900 | B1 | 5/2002 | Barbee, Jr. et al. | 378/84 |
| 6,452,194 | B1 | 9/2002 | Bijkerk et al. | 250/492.2 |
| 6,452,199 | B1 | 9/2002 | Partlo et al. | 250/504 |
| 6,493,423 | B1 | 12/2002 | Bisschops | 378/119 |
| 6,566,667 | B1 | 5/2003 | Partlo et al. | 250/504 |
| 6,566,668 | B1 | 5/2003 | Rauch et al. | 250/504 |
| 6,576,912 | B1 | 6/2003 | Visser et al. | 250/492.2 |
| 6,580,517 | B1 | 6/2003 | Lokai et al. | 356/519 |
| 6,586,757 | B1 | 7/2003 | Melnychuk et al. | 250/504 |
| 6,590,959 | B1 | 7/2003 | Kandaka et al. | 378/119 |
| 6,647,086 | B1 | 11/2003 | Amemiya et al. | 378/34 |
| 6,683,936 | B1 * | 1/2004 | Jonkers | 378/34 |
| 6,744,060 | B1 | 6/2004 | Ness et al. | 315/111.01 |
| 6,770,896 | B1 * | 8/2004 | Schriever | 250/504 R |
| 6,804,327 | B1 | 10/2004 | Schriever et al. | 378/119 |
| 6,815,700 | B1 | 11/2004 | Melnychuk et al. | 250/504 |
| 6,865,255 | B1 | 3/2005 | Richardson | 379/119 |
| 2003/0068012 | A1 | 4/2003 | Ahmad et al. | 378/119 |
| 2003/0219056 | A1 | 11/2003 | Yager et al. | 372/57 |

OTHER PUBLICATIONS

Apruzese, J.P., "X-Ray Laser Research Using Z Pinches," *Am. Inst. of Phys.* 399-403, (1994).

Bollanti, et al., "Compact Three Electrodes Excimer Laser IANUS for a POPA Optical System." *SPIE Proc.* (2206) 144-153, (1994).

Bollanti, et al., "Ianus, the three-electrode excimer laser," *App. Phys. B (Lasers & Optics)* 66(4):401-406, (1998).

Braun, et al., "Multi-component EUV Multilayer Mirrors," *Proc. SPIE*, 5037:2-13, (2003).

Choi, et al., "A $10^{13}$ A/s High Energy Density Micro Discharge Radiation Source," *B. Radiation Characteristics*, p. 287-290.

Choi, et al., "Fast pulsed hollow cathode capillary discharge device," *Rev. of Sci. Instrum.* 69(9):3118-3122 (1998).

Choi et al., Temporal development of hard and soft x-ray emission from a gas-puff Z pinch, Rev. Sci. Instrum. 57(8), pp. 2162-2164 (Aug. 1986).

H. Eichler, et al., "Phase conjugation for realizing lasers with diffraction limited beam quality and high average power," Technisische Universitat Berlin, Optisches Institut, (Jun. 1998).

R. Fedosejevs and A. A. Offenberger, "Subnanosecond pulses from a KrF Laser pumped $SF_6$ Brillouin Amplifier", IEEE J. QE 21, 1558-1562 (1985).

Feigl, et al., "Heat Resistance of EUV Multilayer Mirrors for Long-time Applications," *Microelectric Engineering*, 57-58:3-8, (2001).

Fomenkov, et al., "Characterization of a 13.5nm Source for EUV Lithography based on a Dense Plasma Focus and Lihium Emission," Sematech Intl. Workshop on EUV Lithography (Oct. 1999).

Giordano and Letardi, "Magnetic pulse compressor for prepulse discharge in spiker-sustainer excitati technique for XeCl lasers," Rev. Sci. Instrum 65(8), pp. 2475-2481 (Aug. 1994).

Hansson, et al., "Xenon liquid jet laser-plasma source for EUV lithography," Emerging Lithographic Technologies IV, *Proc. Of SPIE*, vol. 3997:729-732 (2000).

Jahn, Physics of Electric Propulsion, McGraw-Hill Book Company, (Series in Missile and Space U.S.A.), Chap. 9, "Unsteady Electromagnetic Acceleration," p. 257 (1968).

Shibin Jiang, et al., "Compact multimode pumped erbium-doped phosphate fiber amplifiers," Optical Engineering, vol. 42, Issue 10, pp. 2817-2820 (Oct. 2003).

Kato, Yasuo, "Electrode Lifetimes in a Plasma Focus Soft X-Ray Source," *J. Appl. Phys.* (33) Pt. 1, No. 8:4742-4744 (1991).

Kato, et al., "Plasma focus x-ray source for lithography," *Am. Vac. Sci. Tech. B.*, 6(1): 195-198 (1988).

K. Kuwahara et al., "Short-pulse generation by saturated KrF laser amplification of a steep Stokes pulse produced by two-step stimulated Brillouin scattering", J. Opt. Soc. Am. B 17, 1943-1947 (2000).

Lange, Michael R., et al., "High gain coefficient phosphate glass fiber amplifier," NFOEC 2003, paper No. 126.

Lebert, et al., "Soft x-ray emission of laser-produced plasmas using a low-debris cryogenic nitrogen target," *J. App. Phys.*, 84(6):3419-3421 (1998).

Lebert, et al., "A gas discharge based radiation source for EUV-lithography," Int'l. Conf. Micro and Nano-Engineering 98 (Sep. 22-24, 1998) Leuven, Belgium.

Lebert, et al., "Investigation of pinch plasmas with plasma parameters promising ASE," Inst. Phys. Conf. Ser No. 125: Section 9, pp. 411-415 (1992) Schiersee, Germany.

Lebert, et al., "Comparison of laser produced and gas discharge based EUV sources for different applications," Int'l. Conf. Micro- and Nano-Engineering 98 (Sep. 22-24, 1998) Leuven, Belgium.

Lee, Ja H., "Production of dense plasmas in hypocycloidal pinch apparatus," *The Phys. Of Fluids*, 20(2):313-321 (1977).

Lewis, Ciaran L.S., "Status of Collision-Pumped X-ray Lasers," *Am Inst. Phys.* pp. 9-16 (1994).

Lowe, "Gas plasmas yield X-rays for Lithography," Electronics, pp. 40-41 (Jan. 27, 1982).

Malmqvist, et al., "Liquid-jet target for laser-plasma soft x-ray generation," *Am. Inst. Phys.* 67(12):4150-4153 1996).

Mather, "Formation of a High-Density Deuterium Plasma Focus," The Physics of Fluids, 8(2), 366-377 (Feb. 1965).

Mather, et al., "Stability of the Dense Plasma Focus," *Phys. Of Fluids*, 12(11):2343-2347 (1969).

Matthews and Cooper, "Plasma sources for x-ray lithography," SPIE, 333, Submicron Lithography, pp. 136-139 (1982).

Mayo, et al., "A magnetized coaxial source facility for the generation of energetic plasma flows," *Sci. Technol.* vol. 4:pp. 47-55 (1994).

Mayo, et al., "Initial Results on high enrhalpy plasma generation in a magnetized coaxial source," *Fusion Tech* vol. 26:1221-1225 (1994).

Nilsen, et al., "Analysis of resonantly photopumped Na-Ne x-ray-laser scheme," *Am Phys. Soc.* 44(7):4591-4597 (1991).

H. Nishioka et al, "UV saturable absorber for short-pulse KrF laser systems", Opt. Lett. 14, 692-694 (1989).

Orme, et al., "Electrostatic charging and deflection of nonconventional droplet streams formed from capillary stream breakup," *Physics of Fluids*, 12(9):2224-2235, (Sep. 2000).

Orme, et al., "Charged Molten Metal Droplet Deposition As a Direct Write Technology", MRS 2000 Spring Meeting, San Francisco, (Apr. 2000).

Pant, et al., "Behavior of expanding laser produced plasma in a magnetic field," *Physica Scripta*, T75:104-111, (1998).

Partlo, et al., "EUV (13.5nm) Light Generation Using a Dense Plasma Focus Device," *SPIE Proc. On Emerging Lithographic Technologies III*, vol. 3676, 846-858 (Mar. 1999).

Pearlman and Riordan, "X-ray lithography using a pulsed plasma source," *J. Vac. Sci. Technol.*, pp. 1190-1193 (Nov./Dec. 1981).

Porter, et al., "Demonstration of Population Inversion by Resonant Photopumping in a Neon Gas Cell Irradiated by a Sodium Z Pinch," *Phys. Rev. Let.*, 68(6):796-799, (Feb. 1992).

Price, Robert H., "X-Ray Microscopy using Grazing Incidence Reflection Optics," *Am. Inst. Phys.*, pp. 189-199, (1981).

Qi, et al., "Fluorescence in Mg IX emission at 48.340 Å from Mg pinch plasmas photopumped by Al XI line radiation at 48.338 Å," *The Am. Phys. Soc.*, 47(3):2253-2263 (Mar. 1993).

Scheuer, et al., "A Magnetically-Nozzled, Quasi-Steady, Multimegawatt, Coaxial Plasma Thruster," *IEEE: Transactions on Plasma Science*, 22(6) (Dec. 1994).

S. Schiemann et al., "Efficient temporal compression of coherent nanosecond pulses in a compact SBS generator-amplifier setup", IEEE J. QE 33, 358-366 (1997).

Schriever, et al., "Laser-produced lithium plasma as a narrow-band extended ultraviolet radiation source for photoelectron spectrometry," *App. Optics*, 37(7):1243-1248, (Mar. 1998).

Schriever, et al., "Narrowband laser produced extreme ultraviolet sources adapted to silicon/molybdenum multilayer optics," *J. of App. Phys.*, 83(9):4566-4571, (May 1998).

Shiloh et al., "Z Pinch of a Gas Jet," Physical Review Lett., 40(8), pp. 515-518 (Feb. 20, 1978).

Silfvast, et al., "High-power plasma discharge source at 13.5 nm and 11.4 nm for EUV lithography," *SPIE*, vol. 3676:272-275, (Mar. 1999).

Silfvast, et al., "Lithium hydride capillary discharge creates x-ray plasma at 13.5 nanometers," *Laser Focus World*, p. 13, (Mar. 1997).

Stallings et al., "Imploding argon plasma experiments," Appl. Phys. Lett., 35(7), pp. 524-526 (Oct. 1, 1979).

Takahashi, E., et al., "KrF laser picosecond pulse source by stimulated scattering processes", Opt. Commun. 215, 163-167 (2003).

Takahashi, E., et al., "High-intensity short KrF laser-pulse generation by saturated amplification of truncated leading-edge pulse", Opt. Commun. 185, 431-437 (2000).

Tillack, et al., "Magnetics Confinement of an Expanding Laser-Produced Plasma", UC San Diego, Center for Energy Research, UCSD Report & Abramova—Tornado Trap.

Wilhein, et al., "A slit grating spectrograph for quantitative soft x-ray spectroscopy," Am. Inst. Of Phys. Rev. of Sci. Instrum., 70(3):1694-1699, (Mar. 1999).

Wu, et al., "The vacuum Spark and Spherical Pinch x-ray/EUV Point Sources," *SPIE. Conf. On. Energing Tech. III*, Santa Clara, CA, vol. 3676:410-420, (Mar. 1999).

Zombeck, M.V., "Astrophysical Observations with High Resolution X-ray Telescope," *Am. Inst. Of Phys.*, pp. 200-209, (1981).

\* cited by examiner

SYSTEMS FOR PROTECTING INTERNAL COMPONENTS OF AN EUV LIGHT SOURCE FROM PLASMA-GENERATED DEBRIS

FIELD OF THE INVENTION

The present invention relates to extreme ultraviolet ("EUV") light generators providing EUV light from a plasma created from a source material and collected and directed to a focus for utilization outside of the EUV light source generation chamber, e.g., for semiconductor integrated circuit manufacturing photolithography process performing machines, e.g., at wavelengths of around 20 nm and below.

RELATED APPLICATIONS

The present application is related to U.S. patent application Ser. No. 10/979,945, entitled LPP EUV LIGHT SOURCE, filed on Nov. 1, 2004, and Ser. No. 10/900,839, entitled EUV LIGHT SOURCE, filed on Jul. 27, 2004, and Ser. No. 10/803,526, entitled HIGH REPETITION RATE LPP EUV LIGHT SOURCE, filed on Mar. 17, 2004, and Ser. No. 10/798,740, entitled COLLECTOR FOR EUV LIGHT, filed on Mar. 10, 2004, the disclosures of each of which is incorporated by reference.

BACKGROUND OF THE INVENTION

Extreme ultraviolet ("EUV") light, e.g., electromagnetic radiation having wavelengths of around 20 nm or less (also sometimes referred to a soft x-rays), and including light at a wavelength of about 13.5 nm, can be used in photolithography processes to produce extremely small features in substrates, e.g. silicon wafers.

Methods to produce EUV light include, but are not necessarily limited to, converting a material into a plasma state that has an element, e.g. xenon, lithium or tin, with an emission line in the EUV range. In one such method, often termed electric discharge produced plasma ("DPP"), the plasma may be produced by an electrical discharge between a pair of electrodes. In another method, the required plasma can be produced by irradiating a target material, such as a droplet, stream or cluster of material having the required line-emitting element, with a laser beam. This later process is referred to as laser produced plasma ("LPP").

For each of these processes, the plasma is typically produced in a sealed vessel, e.g. vacuum chamber, and monitored using various types of metrology equipment. In addition to generating EUV radiation, these plasma processes also typically generate undesirable by-products in the plasma chamber which can include heat, high energy ions and scattered debris from the plasma formation, e.g., atoms and/or clumps of source material that is not fully ionized in the plasma formation process.

These plasma formation by-products can potentially damage or reduce the operational efficiency of the various plasma chamber optical elements including, but not limited to, the surfaces of metrology detectors, windows used to image the plasma formation process, and in the case of LPP, the laser input window. The heat, high energy ions and/or source material debris may be damaging to the optical elements in a number of ways, including heating them, coating them with materials which reduce light transmission, penetrating into them and, e.g., damaging structural integrity and/or optical properties, e.g., the ability of a mirror to reflect light at such short wavelengths, corroding or eroding them and/or diffusing into them. In addition, some optical elements, e.g. the laser input window, form a part of the vacuum chamber and are thus placed under a stress when a vacuum is present in the plasma chamber. For these elements, deposits and heat can combine to fracture (i.e. crack) the element resulting in a loss of vacuum and requiring a costly repair.

Accessing contaminated or damaged optical elements in the plasma chamber for the purpose of cleaning or replacing the elements can be expensive, labor intensive and time-consuming. In particular, these systems typically require a rather complicated and time consuming purging and vacuum pump-down of the plasma chamber prior to a re-start after the plasma chamber has been opened. This lengthy process can adversely affect production schedules and decrease the overall efficiency of light sources for which it is typically desirable to operate with little or no downtime.

With the above in mind, Applicants disclose shielding systems and methods useful for increasing the service life of various plasma chamber optical elements and for increasing the time between maintenance operations that require opening of the plasma chamber.

SUMMARY OF THE INVENTION

Systems and methods are disclosed for protecting an EUV light source plasma production chamber optical element surface from debris generated by plasma formation. In one aspect of an embodiment of the present invention, a light transmitting shield is disclosed which is movable into a cleaning chamber from an initial position where the shield is interposed between a plasma formation site and the optical element. In the initial position, the shield prevents debris directed toward the optical element surface from reaching the surface.

In another aspect of an embodiment of the present invention, a shield for a plasma chamber optical element is disclosed which may be heated to a temperature sufficient to remove one or more species of debris material that has deposited on the shield.

In still another aspect of an embodiment of the present invention, a shield system for a plasma chamber optical element is disclosed which comprises at least one hollow tube positioned in between the optical element and a plasma formation site. The tube is oriented to capture debris while allowing light to pass through the lumen (i.e. bore) of the tube via reflection at relatively small angles of grazing incidence.

DETAILED DESCRIPTION OF PREFERRED EMBODIMENTS

Figure 1:
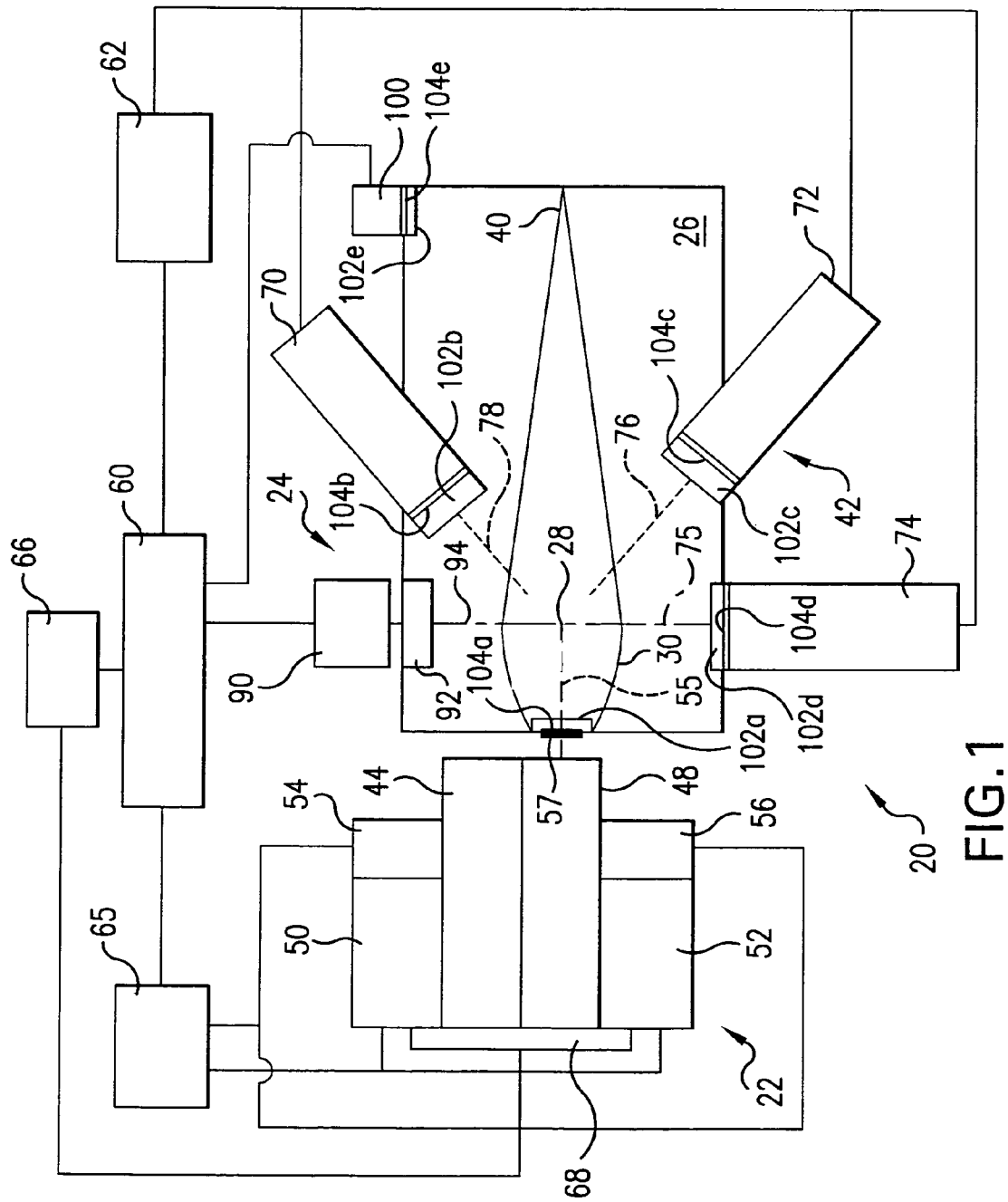
FIG. 1 shows a schematic view of an overall broad conception for a laser-produced plasma EUV light source according to an aspect of the present invention.

Turning now to FIG. 1 there is shown a schematic view of an exemplary production EUV light source, e.g., a laser produced plasma EUV light source 20 according to an aspect of the present invention. Although aspects of the present invention are illustrated with reference to a laser produced plasma (LPP), it is to be appreciated that the present invention is equally applicable to other types of light sources which produce a plasma including an electric discharge produced plasma ("DPP"), a representative construction of which is disclosed in co-owned U.S. Pat. No. 6,815,700 which is hereby incorporated by reference.

Continuing with FIG. 1, an LPP light source 20 may contain a pulsed laser system 22, e.g., a gas discharge excimer or molecular fluorine laser operating at high power and high pulse repetition rate and may be a MOPA configured laser system, e.g., as shown in U.S. Pat. Nos. 6,625, 191, 6,549,551, and 6,567,450. The light source 20 may also include a target delivery system 24, e.g., delivering targets in the form of liquid droplets, a liquid stream, solid particles or clusters, solid particles contained within liquid droplets or solid particles contained within a liquid stream. The targets may be delivered by the target delivery system 24, e.g., into the interior of a chamber 26 to a plasma formation site 28, otherwise known as an ignition site or the sight of the "fire ball".

Laser pulses may be delivered from the pulsed laser system 22 along a laser optical axis 55 through a laser input window 57 in the chamber 26 to the irradiation site, suitably focused, to create an ignition or fire ball that forms a plasma, having certain characteristics, including wavelength of the EUV light produced, type and amount of debris released from the plasma during or after ignition, according to the material of the target.

The light source may also include a collector 30. e.g., a reflector, e.g., in the form of a truncated ellipse, with an aperture to allow the laser light to pass through and reach the ignition site 28. The collector 30 may be, e.g., an elliptical mirror that has a first focus at the ignition site 28 and a second focus at a so-called intermediate point 40 (also called the intermediate focus 40) where the EUV light is output from the light source and input to, e.g., an integrated circuit lithography tool (not shown). The system 20 may also include a target position detection system 42.

The pulsed system 22 may include, e.g., a master oscillator-power amplifier ("MOPA") configured dual chambered gas discharge laser system having, e.g., an oscillator laser system 44 and an amplifier laser system 48, with, e.g., a magnetic reactor-switched pulse compression and timing circuit 50 for the oscillator laser system 44 and a magnetic reactor-switched pulse compression and timing circuit 52 for the amplifier laser system 48, along with a pulse power timing monitoring system 54 for the oscillator laser system 44 and a pulse power timing monitoring system 56 for the amplifier laser system 48. The system 20 may also include an EUV light source controller system 60, which may also include, e.g., a target position detection feedback system 62 and a firing control system 65, along with, e.g., a laser beam positioning system 66.

The target position detection system may include a plurality of droplet imagers 70, 72 and 74 that provide input relative to the position of a target droplet, e.g., relative to the ignition site and provide these inputs to the target position detection feedback system, which can, e.g., compute a target position and trajectory, from which a target error can be computed, if not on a droplet by droplet basis then on average, which is then provided as an input to the system controller 60, which can, e.g., provide a laser position, direction and timing correction signal, e.g., to the laser beam positioning system 66 that the laser beam positioning system can use, e.g., to control the laser timing circuit and/or to control the laser position and direction changer 68, e.g., to change the focus point of the laser beam to a different ignition point 28.

The imager 74 may, e.g., be aimed along an imaging line 75, e.g., aligned with a desired trajectory path of a target droplet 94 from the target delivery mechanism 92 to the desired ignition site 28 and the imagers 72 and 76 may, e.g., be aimed along respective intersecting imaging lines 76 and 78 that intersect, e.g., along the desired trajectory path at some point along the trajectory path before the desired ignition site 28.

The target delivery control system 90, in response to a signal from the system controller 60 may, e.g., modify the release point of the target droplets 94 as released by the target delivery mechanism 92 to correct for errors in the target droplets arriving at the desired ignition site 28. An EUV light source detector 100 positioned at or near the intermediate focus 40 may also provide feedback to the system controller 60 that can be, e.g., indicative of the errors in such things as the timing and focus of the laser pulses to properly intercept the target droplets in the right place and time for effective and efficient EUV light production.

As shown schematically in FIG. 1 and described in more detail below, an aspect of an embodiment of the present invention includes shielding systems 102a–e for protecting respective plasma chamber optical element surfaces 104a–e from debris generated at the plasma formation site 28. In particular, as shown, shield system 102a protects surface 104a of laser input window 57, shield systems 102b, 102c and 102d protect respective surfaces 104b, 104c and 104d of respective imaging windows of imagers 70, 72 74 and shield system 102e protects surface 104e of EUV light source detector 100.

Figure 2:
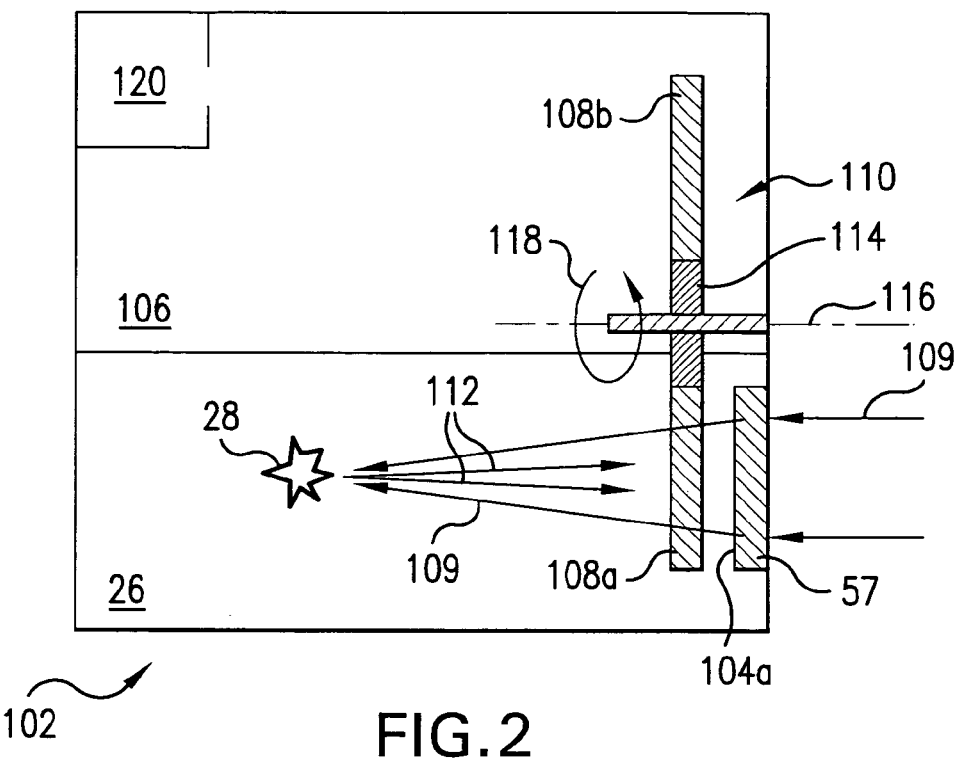
FIG. 2 shows in schematic, cross-sectional form a possible embodiment of a system for protecting an optical element surface from plasma-source debris according to an aspect of an embodiment of the present invention.

FIG. 2 shows a system, illustrated schematically and designated generally system 102, for protecting a surface 104a of an optical element, e.g. laser input window 57, from debris resulting from plasma formation according to an aspect of an embodiment of the present invention. Although the system 102 is shown for protecting a laser input window 57 in FIG. 2, it is to be appreciated that the system 102 shown can be used to protect other optical components including, but not limited to, imaging windows and light detector input surfaces. As shown in FIG. 2, the system 102 may include a cleaning chamber 106 that may be positioned adjacent to the plasma chamber 26.

Discrete shields 108a,b made of a transparent material, e.g. a material that is transparent to the laser beam 109 (or to light being sampled by an external metrology device, e.g., EUV light or visible light) may be mounted on a mechanism 110 that is configured to sequentially move each shield 108 from the plasma chamber 26 to the cleaning chamber 106 and then back into the plasma chamber 26, and so forth. More specifically, the mechanism can locate each shield 108 in a first position (corresponding to the position shown for shield 108a) where the shield 108 is interposed between the plasma formation site 28 and the laser input window 57 to prevent debris 112 that is directed toward the laser input window 57 from reaching the window 57. The mechanism 110 can be activated to then move the shield 108 from the first position described above to a second position (corresponding to the position shown for shield 108b) in which the shield 108 may be disposed within the cleaning chamber 106 to clean deposited debris from the shield 108. Although two shields 108 are shown in FIG. 2, it is to be appreciated that more than two shields 108 and as few as one shield 108 may be used. In addition, a contiguous annularly shaped, strip of transparent material spanning 360 degrees may be used in which only a portion of the strip is interposed between the plasma formation site 28 and the laser input window 57 at any one time. For this case, the interposed portion of the continuous strip constitutes a "shield" for purposes of the present disclosure, and accordingly, the strip constitutes a plurality of shields.

As shown in FIG. 2, the mechanism 110 may include a wheel 114 defining a wheel axis 116. The shield(s) 108 may be attached to the wheel 114, as shown. When activated, a rotation assembly in the mechanism 110 rotates the shield(s) 108 (see arrow 118) about the wheel axis 116 to move the shield 108 from the plasma chamber 26 to the cleaning chamber 106, and after cleaning, back into the plasma chamber 26. This rotation may be performed in increments or may be continuous. With this structural arrangement, one or more shields 108 on the wheel 114 may be cleaned in the cleaning chamber 106, and simultaneously, another shield 108 on the wheel 114 may be used to prevent plasma source debris 112 from reaching the laser input window 57 in the plasma chamber 26.

In the cleaning chamber 106, an etchant source 120 may be provided to establish a concentration of an etchant such as HBr for cleaning debris from the shield 108. Alternatively, suitable etchants can include, but are not necessarily limited to etchants such as $Br_2$, $Cl_2$, $HC_1$, $H_2$ and $HCF_3$. For example, an HBr concentration of a few Torr can be used in the cleaning chamber to clean the shields 108. In some cases, a relatively small HBr concentration, e.g. 10 milliTorr may also be maintained in the plasma chamber 46 to etch structures therein. With this arrangement, only a reasonably tight seal between chamber 26 and 106 near the mechanism 110 may be required. In some implementations, an apparatus (not shown) may be included in the cleaning chamber to mechanically clean the shield 108. Alternatively, or in addition to either mechanical cleaning, etching or both, a heat source (not shown) can be used to remove deposited material from the shield 108 (see further discussion below regarding removal of deposit debris by heating). In still another variation, plasma etching or plasma assisted etching may be used in the cleaning chamber 106, e.g., an rf plasma using Argon at a pressure of about 1 mTorr.

Figure 2A:
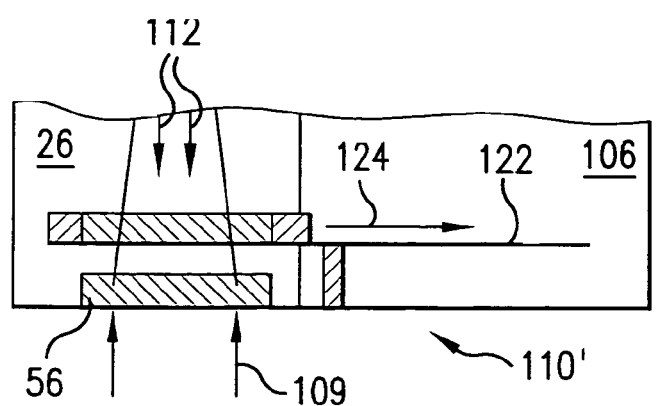
FIG. 2A shows in schematic, cross-sectional form an aspect of an embodiment of a slider mechanism for moving a shield into a cleaning chamber according to an aspect of an embodiment of the present invention.

FIG. 2A shows another aspect of an embodiment in accordance with the present invention in which the system includes a mechanism 110' which comprises a slider assembly 122 to move the shield 108 along a linear path (in the direction of arrow 124) from the plasma chamber 26 to the cleaning chamber 106. Although not shown, it is to be appreciated that multiple slider assemblies (each operable on a different shield) may be used allowing the use of one shield 108 in the plasma chamber 26 while one or more shields 108 are simultaneously cleaned in the cleaning chamber 106.

The ability to protect the laser input window 57 from heat and debris as described above may also facilitate the positioning of the window 57 at a location that is closer to the plasma formation site 28 (than a corresponding unprotected window). This, in turn, may be beneficial when the laser input window 57 also functions as a lens. In this case, movement of the lens closer to the plasma formation site may allow the use of a laser source having a reduced laser divergence and pointing stability requirements.

Figure 3:
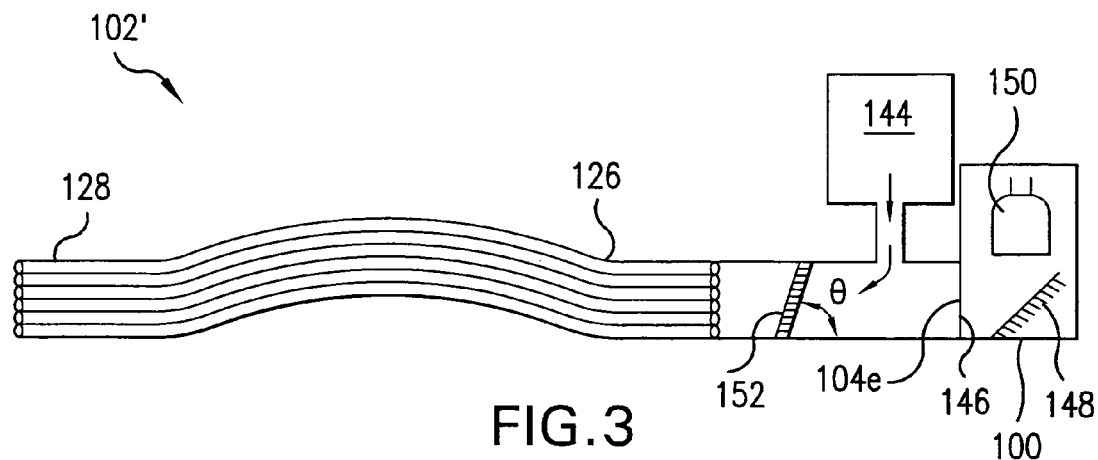
FIG. 3 shows a schematic, side view of an aspect of another possible embodiment of a shield system for protecting a plasma chamber optical element from plasma source material debris.
Figure 3A:
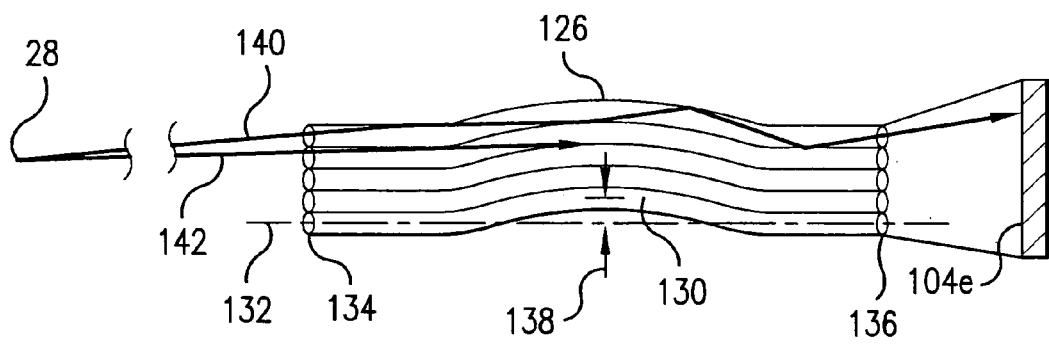
FIG. 3A shows a schematic, side view of a plurality of hollow tubes illustrating the path of an exemplary light ray through a hollow tube and the path of an exemplary debris particle being captured by a hollow tube.

FIG. 3 shows a system according to another aspect of an embodiment of the present invention, illustrated schematically and designated generally system 102', for protecting a surface 104d of an optical element, e.g. EUV light detector 100, from debris resulting from plasma formation. As shown, the system 102' may include a plurality of hollow tubes 126, e.g. so-called capillary tubes, with each tube having a tube wall that surrounds a tube lumen (i.e. bore). Tubes 126 may be made of a material, e.g. glass, metal or ceramic, e.g. borosilicate material, which reflects EUV light at grazing angles of incidence, e.g. grazing incidence reflection at small (<10 degrees) angles of grazing incidence where the EUV reflectivity of smooth surfaces is relatively high for most materials. As shown, the tubes 126 may be grouped together and housed within a stainless steel housing tube 128 having a similar shape as the tubes 126. In an exemplary embodiment, about 50 bent glass capillary tubes 126 (1 mm outer diameter, 0.78 mm inner diameter, 150 mm long) may be mounted inside of a bent stainless steel tube 128. As shown in FIG. 3A, the tubes 126 may be shaped having a midsection 130 that may be laterally offset from a tube axis 132 defined by the tube ends 134, 136. In particular, the midsection 130 may be offset by a distance 138 that is larger than inner diameter of the tube 126.

FIG. 3A shows that the tubes 126 may be interposed between the plasma formation site 28 and the surface 104e. FIG. 3A also shows an exemplary path 140 of an EUV light ray and the exemplary path 142 of a debris particle. As shown, the EUV light ray passes through the lumen (i.e. bore) of a tube 126 after a series of small angle grazing incidence reflections from the inner wall surface of the tube 126 and reaches the surface 104a. On the other hand, as shown, the debris particle may strike the inner wall of the hollow tube and stick to the inner wall. Moreover, in some cases, the accumulation of debris on the inner wall may result in a smooth enough surface to adequately reflect EUV light at grazing angles of incidence. Use of the tubes 126 may have an advantage over the use of flat mirrors to direct light to a detector in that they will automatically direct the light towards the end of the tube and no complicated alignment is required, like in the case of redirecting mirrors.

FIG. 3 also shows that the system 102' may include a sub-system 144 for releasing a gas for flow through each tube 126. In each tube 126, the gas may collide with and deflect debris particles into the inner tube wall. The gas then exits each tube 126 enters the plasma chamber. Exemplary gases for this purpose may include gases such as argon and helium which are relatively transparent to EUV light. As shown, the gas may be introduced into the stainless steel tube 128 and the detector 100. Detector 100 may include one or more thin EUV filter foils 146, a multi-layer mirror 148 and a photodiode detector 150, as shown.

The system 102' may also include a partially transmitting (e.g. approximately 50% transmitting) plate 152 having small straight channels (several μm diameter, so-called collimated holes) located between the tubes 126 and the detector 100 to block remaining debris particles from hitting the detector 100. For example, the channel plate can be formed of a glass capillary array having a length of about 1–5 mm and capillary diameters between about 5 μm and 100 μM). Also, the channel plate 152 can also be mounted in the stainless steel tube 128 at an angle, θ, e.g. 5–10 degrees, to avoid a straight passage through the channels and ensure grazing-incidence reflection.

Figure 3B:
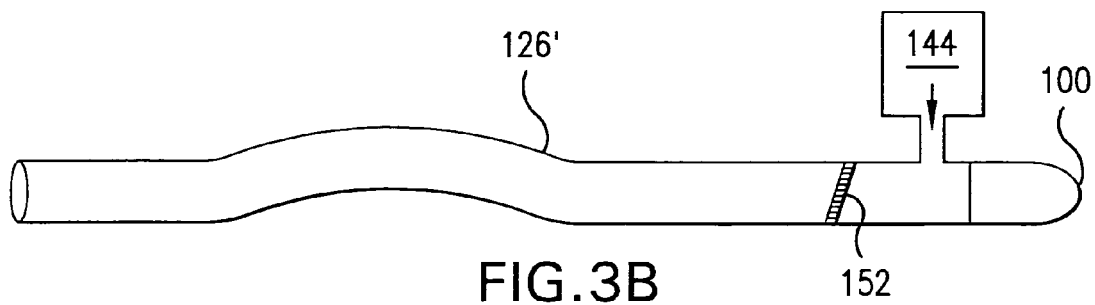
FIG. 3B shows a schematic, side view of an aspect of another possible embodiment of a shield system for protecting a plasma chamber optical element from plasma source material debris having one bent hollow tube.
Figure 3C:
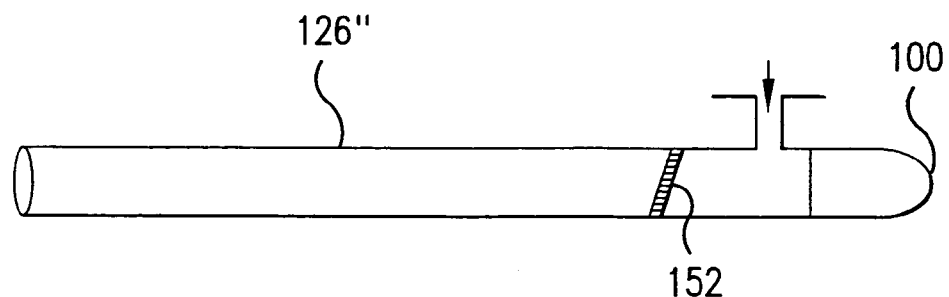
FIG. 3C shows a schematic, side view of an aspect of another possible embodiment of a shield system for protecting a plasma chamber optical element from plasma source material debris having one straight hollow tube.

FIG. 3B shows another aspect of an embodiment of the present invention having a single bent, hollow tube 126, for protecting a surface 104d of an optical element, e.g. EUV light detector 100, from debris resulting from plasma formation. FIG. 3C shows yet another aspect of an embodiment of the present invention having a single straight, hollow tube 126", for protecting a surface 104d of an optical element, e.g. EUV light detector 100, from debris resulting from plasma formation. Long straight tubes 126" may be used to confine the detector viewing angle. The single tubes 126' and 126" can be combined with a gas flow from a gas sub system 144 to increase the probability of collisions with debris particles and may include a partially transmitting plate 152. It is to be appreciated that a plurality of straight tubes 126" could be bundle together in a manner similar to the bundled bent tubes 126 shown in FIG. 3.

Figure 4:
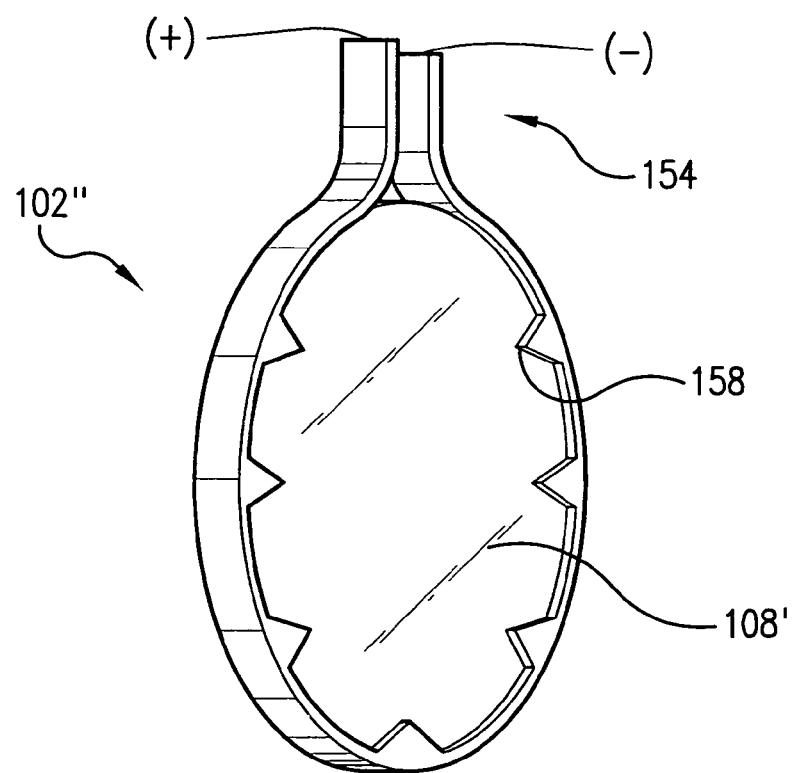
FIG. 4 shows a schematic, side view of an aspect of another possible embodiment of a shield system for protecting a plasma chamber optical element from plasma source material debris having a heater for heating a light transmitting shield.

FIG. 4 shows a system according to another aspect of an embodiment of the present invention, designated generally system 102", for protecting a surface of an optical element, e.g. a laser input window, imager window or EUV light detector, from debris resulting from plasma formation. As shown, the system 102" may include a shield 108' made of a light transmissive material, e.g. a material that is substantially transparent to an LPP laser beam (or to light being sampled by an external metrology device, e.g., EUV light or visible light), e.g. $CaF_2$, fused silica or $MgF_2$.

In use, the shield 108' is positioned inside the plasma chamber 26 (see FIG. 1) and located between the plasma formation site 28 and an optical element to thereby allow debris to temporarily deposit on the surface of the shield 108'. The system 102" may further include a heater 154 to heat the shield 108' to a temperature sufficient to remove at least a portion the deposited debris, e.g. to remove portions or all of one or more species.

For example, the heater may heat the shield 108' to a temperature sufficient vaporize at least a portion of a deposited material. For a plasma source material which comprises Li, the heater 154 may be designed to heat the shield 108' to a temperature in the range of about 400 to 550 degrees C. to vaporize Li from the shield surface.

In some cases, the heater may heat the shield 108' to a temperature sufficient to initiate a chemical reaction between a deposited material and an etchant gas that is introduced into the plasma chamber. For a plasma source material which comprises Sn, the heater 154 may be designed to heat the shield 108' to a temperature in the range of about 200 to 325 degrees C. to initiate a reaction between Sn deposits and gaseous etchants, e.g. HBr, to create a reaction product that is then removed from the shield surface, e.g. by evaporation or wicking, e.g. using copper wire.

As shown in FIG. 4, the heater may comprise a band 156, made of a conductive material, e.g. Mo, that is positioned in contact with the shield 108' and a current source for passing a current through the conductive band 156. The band 156 may also be formed with extensions 158 allowing the band 154 to hold and mechanically support the shield 108'. Other means of heating the shield 108' include, but are not limited to radiative heaters, microwave heaters, rf heaters and combinations thereof.

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention (s) that will be understood and appreciated by those skilled in the art. The appended claims are intended in scope and meaning to cover not only the disclosed aspects of embodiments of the present invention(s) but also such equivalents and other modifications and changes that would be apparent to those skilled in the art.

We claim:

1. A system for protecting an EUV light source plasma production chamber optical element surface from debris generated by plasma formation, the system comprising:
   a shield which is movable relative to the surface and movable into a position wherein the shield is interposed between a plasma formation site and the optical element to prevent debris directed along a path toward the optical element surface from reaching the surface, the system allowing for light passage between the plasma formation site and the optical element surface, and
   a cleaning chamber; and
   a mechanism to move the shield to the cleaning chamber for cleaning therein and thereafter move the shield from the cleaning chamber to the plasma chamber to interpose the shield between the plasma formation site and the chamber optical element.

2. The system or claim 1 further comprising:
   wherein the mechanism comprises a slider to move the shield along a linear path from the plasma chamber to the cleaning chamber.

3. The system of claim 1 further comprising:
   wherein the mechanism comprises a wheel defining a wheel axis, with the shield attached to the wheel; and
   a rotator attached to the wheel to rotate the shield about the wheel axis to move the shield from the plasma chamber to the cleaning chamber.

4. The system of claim 1 further comprising:
   wherein a plasma is generated at the plasma formation site by an electrical discharge between a pair of electrodes.

5. The system of claim 1 further comprising:
   wherein a plasma is generated at the plasma formation site by irradiating a target material with a laser beam.

6. The system of claim 5 further comprising:
   wherein the plasma chamber is formed with a laser input window for passing the laser beam from a laser source to the plasma formation site and the plasma chamber optical element surface is the laser input window.

7. The system of claim 6 further comprising:
   wherein the laser input window is a lens.

8. The system of claim 5 further comprising:
   wherein a target material is a stream of droplets.

9. The system of claim 1 further comprising:
   wherein the plasma chamber optical element surface is a surface of a light detector.

10. The system of claim 1 further comprising:
    wherein the plasma chamber optical element is an imaging window.

11. A system for protecting an EUV light source plasma production chamber optical element surface from debris generated by plasma formation, the system comprising:
- a cleaning chamber;
- a shield made of a transparent material; and
- a mechanism to move the shield from a first position wherein the shield is interposed between the plasma formation site and the optical element surface to prevent debris directed toward the optical element surface from reaching the surface and a second position wherein the shield is disposed within the cleaning chamber for cleaning therein.

12. The system of claim 11 further comprising:
wherein the mechanism comprises a slider assembly to move the shield along a linear path from the plasma chamber to the cleaning chamber.

13. The system of claim 11 further comprising:
wherein the mechanism comprises a wheel defining a wheel axis, with the shield attached to the wheel; and
a rotation assembly attached to the wheel to rotate tile shield about the wheel axis to move the shield from the plasma chamber to the cleaning chamber.

14. The system of claim 11 further comprising:
wherein the shield is cleaned in the cleaning chamber using an etchant.

15. The system of claim 14 further comprising:
wherein the etchant is selected from the group of etchants consisting of HBr, $Br_2$, $Cl_2$, HCl and $H_2$.

16. The system of claim 11 further comprising:
wherein the shield is cleaned in the cleaning chamber using a plasma formed in the cleaning chamber.

17. A system for protecting an EUV light source plasma production chamber optical element surface from debris generated by plasma formation, the system comprising:
- a shield interposable between a plasma formation site and the optical element to deposit debris thereon;
- a heater to heat the shield to a temperature sufficient to remove at least a portion of the deposited debris, and
- wherein the shield is made of a material selected from the group of materials consisting of $CaF_2$, fused silica and $MgF_2$.

18. A system for protecting an EUV light source plasma production chamber optical element surface from debris generated by plasma formation, the system comprising:
- a shield interposable between a plasma formation site and the optical element to deposit debris thereon;
- a heater to heat the shield to a temperature sufficient to remove at least a portion of the deposited debris, and
- wherein the plasma comprises Sn, an etchant is introduced into the plasma chamber and the heater heats the shield to a temperature greater than 200 degrees C. to initiate a chemical reaction between deposited Sn and the etchant.

19. A system for protecting an EUV light source plasma production chamber optical element surface from debris generated by plasma formation, the system comprising:
- a shield interposable between a plasma formation site and the optical element to deposit debris thereon;
- a heater to heat the shield to a temperature sufficient to remove at least a portion of the deposited debris, and
- wherein the plasma comprises Li and the heater heats the shield to a temperature greater than 400 degrees C. to vaporize deposited Li.

20. The system of claim 18 further comprising:
wherein the system comprises a heater selected from the group or heaters consisting of a radiative heater, a radio-frequency heater and a microwave heater.

* * * * *